United States Patent
Lee et al.

(10) Patent No.: US 7,719,321 B2
(45) Date of Patent: May 18, 2010

(54) SHORT PULSE REJECTION CIRCUIT AND METHOD THEREOF

(75) Inventors: Cheon-Oh Lee, Cheonan-si (KR); Nam-Hyun Kim, Yongin-si (KR); Ki-Hong Kim, Hwaseong-si (KR); Jong-Seok Kim, Yongin-si (KR); Jin-Ho Oh, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/289,855

(22) Filed: Nov. 6, 2008

(65) Prior Publication Data

US 2009/0189644 A1    Jul. 30, 2009

(30) Foreign Application Priority Data

Nov. 6, 2007    (KR)    ............... 10-2007-0112845

(51) Int. Cl.
    *H03K 9/08*    (2006.01)
(52) U.S. Cl. ........................................ 327/34; 327/551
(58) Field of Classification Search .................. 327/34, 327/311, 379, 551, 558
    See application file for complete search history.

(56) References Cited

U.S. PATENT DOCUMENTS

| | | | |
|---|---|---|---|
| 3,758,856 A * | 9/1973 | Fromm | .................... 324/76.39 |
| 5,065,054 A | 11/1991 | Nguyen et al. | |
| 5,502,448 A | 3/1996 | Cantrell et al. | |
| 6,677,812 B2 * | 1/2004 | Ballan | ........................ 327/551 |
| 7,224,212 B2 | 5/2007 | Tseng | |

FOREIGN PATENT DOCUMENTS

JP    03-295323    12/1991

* cited by examiner

*Primary Examiner*—Lincoln Donovan
*Assistant Examiner*—William Hernandez
(74) *Attorney, Agent, or Firm*—Harness, Dickey & Pierce, P.L.C.

(57) ABSTRACT

A short pulse rejection circuit may include an edge detector, a filter circuit, a comparison circuit, and a gating circuit. The edge detector may delay an input signal to generate a delayed input signal, and detect an edge of the input signal to generate an edge detection signal. The filter circuit may perform a low pass filtering on the edge detection signal to generate a first signal. The comparison circuit may compare the first signal with a reference voltage. The gating circuit may gate the delayed input signal based on an output signal of the comparison circuit. Therefore, the short pulse rejection circuit may have a sufficient setup/hold time margin of a flip-flop, and may sample an input signal even when a state of the input signal does not change during an initial operation.

18 Claims, 9 Drawing Sheets

SHORT PULSE REJECTION CIRCUIT AND METHOD THEREOF

PRIORITY STATEMENT

This application claims priority under 35 USC §119 to Korean Patent Application No. 2007-112845, filed on Nov. 6, 2007 in the Korean Intellectual Property Office (KIPO), the contents of which are herein incorporated by reference in their entirety.

BACKGROUND

1. Technical Field

Example embodiments relate to a short pulse rejection circuit and method thereof.

2. Description of the Related Art

A signal distortion is caused when an electric signal passes through a noisy channel. The polarity of the electric signal may be changed due to the signal distortion, thereby causing a problem in a signal processing.

Typically, a low pass filter is used at an input terminal of a semiconductor integrated circuit in order to reject or remove a noise in an input signal. In such a configuration, a wrong waveform may be caused at an output of the low pass filter when the input signal includes a short pulse, such as a pulse width of 5 nanoseconds (ns).

SUMMARY

Example embodiments may provide a short pulse rejection circuit capable of having a sufficient setup/hold time margin of a flip-flop and capable of sampling an input signal regardless of whether a state of the input signal changes change during an initial operation.

Example embodiments may also provide a method for rejecting a short pulse and a semiconductor device having the short pulse rejection circuit.

According to example embodiments, a short pulse rejection circuit may include an edge detector that delays an input signal to generate a delayed input signal, and that detects an edge of the input signal to generate an edge detection signal, a filter circuit that performs a low pass filtering on the edge detection signal to generate a first signal, a comparison circuit that compares the first signal with a reference voltage, and a gating circuit that gates the delayed input signal based on an output signal of the comparison circuit.

The edge detector may include a first inverter that inverts the input signal, a delay circuit that delays an output signal of the first inverter, and a XOR gate that performs a logical exclusive-OR operation on an output signal of the first inverter and an output signal of the delay circuit.

The delay circuit may include an odd number of inverters.

According to example embodiments, the filter circuit may include a first PMOS transistor having a gate that receives a ground voltage, a source that receives a supply voltage, and a drain that is coupled to an output node, a first NMOS transistor having a gate that receives the edge detection signal, a source that receives the ground voltage, and a drain that is coupled to the output node, a first capacitor coupled between the supply voltage and the output node, and a second capacitor coupled between the ground voltage and the output node.

Each of the first and second capacitor may include a MOS capacitor.

According to example embodiments, the filter circuit may include a first PMOS transistor having a gate that receives a ground voltage and a drain that is coupled to an output node, a second PMOS transistor having a gate that receives a power-down control signal, a drain that is coupled to a source of the first PMOS transistor, and a source that receives the supply voltage, a first NMOS transistor having a gate that receives the edge detection signal, a source that receives the ground voltage, and a drain that is coupled to the output node, a second NMOS transistor having a gate that receives the power-down control signal, a source that receives the ground voltage, and a drain that is coupled to the output node, a first capacitor coupled between the supply voltage and the output node, and a second capacitor coupled between the ground voltage and the output node.

The short pulse rejection circuit may further include a trigger circuit that delays a reset signal by a first time period to generate a first control signal, and that delays the first control signal by a second time period to generate a second control signal, and a selection circuit that selectively outputs one of the first control signal and the output signal of the comparison circuit in response to the second control signal.

The short pulse rejection circuit may sample and output the input signal regardless of whether the input signal transitions during an initial operation.

According to example embodiments, the trigger circuit may include a first delay circuit that delays the reset signal by the first time period to generate the first control signal, and a second delay circuit that delays the first control signal by the second time period to generate the second control signal.

The selection circuit may output the first control signal when a state of the second control signal is a disable state, and may output the output signal of the comparison circuit when the state of the second control signal is an enable state.

An output signal of the selection circuit may be a signal of a pulse waveform that has a pulse width of the second time period.

The first time period may be substantially the same as the second time period.

According to example embodiments, the delayed input signal may be generated by a delay circuit external to the edge detector.

According to example embodiments, a semiconductor device may include a short pulse rejection circuit having an edge detector that delays an input signal to generate a delayed input signal, and that detects an edge of the input signal to generate an edge detection signal, a filter circuit that performs a low pass filtering on the edge detection signal to generate a first signal, a comparison circuit that compares the first signal with a reference voltage, and a gating circuit that gates the delayed input signal based on an output signal of the comparison circuit. The semiconductor device may further include a function circuit that performs a signal processing on the data output signal.

According to example embodiments, a method of rejecting a short pulse may include delaying an input signal to generate a delayed input signal, detecting an edge of the input signal to generate an edge detection signal, performing a low pass filtering on the edge detection signal to generate a first signal, comparing the first signal with a reference voltage, and gating the delayed input based on the comparing.

According to example embodiments, a method of rejecting a short pulse may further include delaying a reset signal by a first time period to generate a first control signal and delaying the first control signal by a second time period to generate a second control signal and selectively outputting one of the first control signal and the output signal of the comparing in response to the second control signal, wherein the gating may gate the delayed input signal in response to the selectively outputting.

According to example embodiments, a method of rejecting a short pulse may further include performing a signal processing on an output signal of the gating.

Therefore, the short pulse rejection circuit according to example embodiments may have a sufficient setup/hold time margin of a flip-flop, and may sample an input signal regardless of whether a state of the input signal changes during an initial operation. In addition, the short pulse rejection circuit according to example embodiments may reduce power consumption by turning off a part of the short pulse rejection circuit in a power-down mode. The semiconductor device according to example embodiments may prevent a signal distortion because the semiconductor device may reject a noise in an input signal.

BRIEF DESCRIPTION OF THE DRAWINGS

The above and other features and advantages will become more apparent by describing in detail example embodiments thereof with reference to the attached drawings in which.

DETAILED DESCRIPTION

Figure 1:
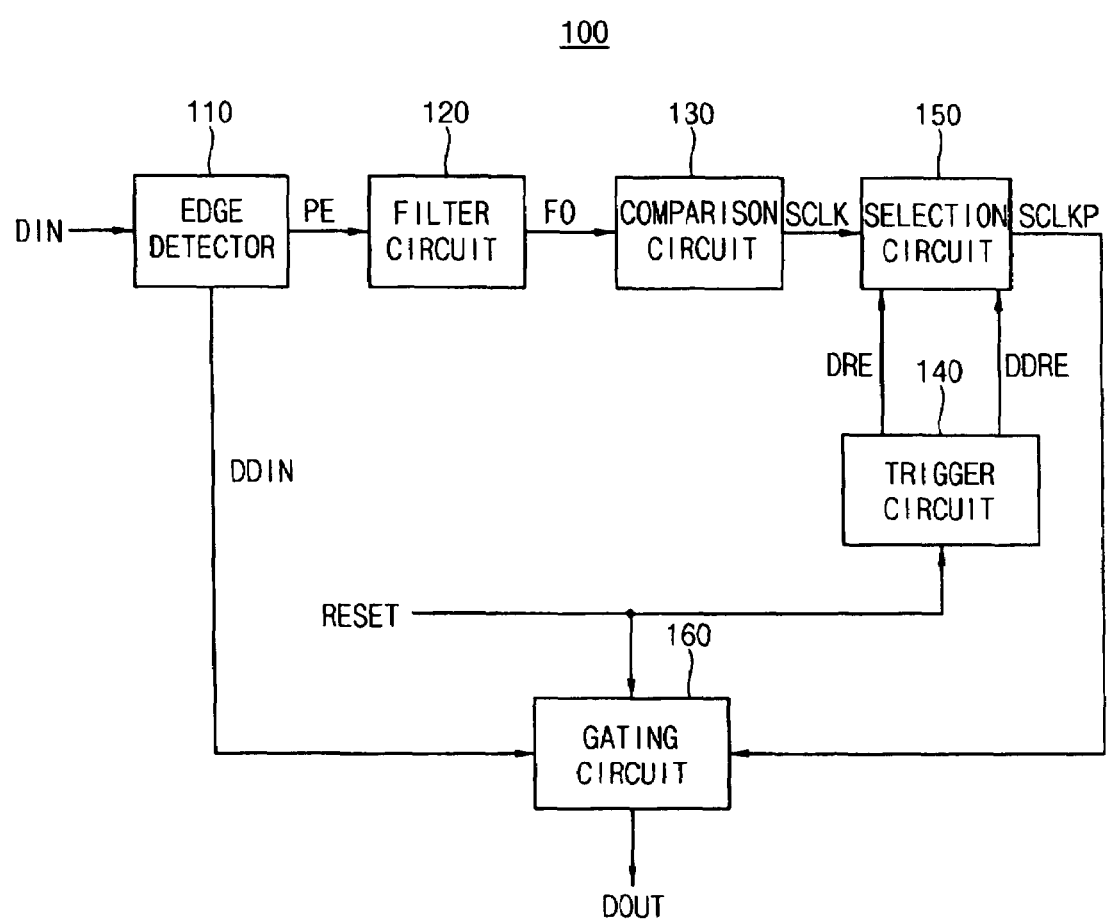
FIG. 1 is a block diagram illustrating a short pulse rejection circuit according to example embodiments.

Various example embodiments will be described more fully with reference to the accompanying drawings, in which embodiments are shown. Example embodiments may, however, be embodied in many different forms and should not be construed as limited to the embodiments set forth herein. Rather, these embodiments are provided so that this disclosure will be thorough and complete, and will fully convey the scope of example embodiments to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures. The figures are intended to depict example embodiments and should not be interpreted to limit the intended scope of the claims. The accompanying figures are not to be considered as drawn to scale unless explicitly noted.

The terminology used herein is for the purpose of describing particular embodiments and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

FIG. 1 is a block diagram illustrating a short pulse rejection circuit according to example embodiments.

Referring to FIG. 1, the short pulse rejection circuit 100 may include an edge detector 110, a filter circuit 120, a comparison circuit 130, a trigger circuit 140, a selection circuit 150, and a gating circuit 160.

The edge detector 110 may delay an input signal DIN to generate a delayed input signal DDIN, and detect an edge of the input signal DIN to generate an edge detection signal PE.

The filter circuit 120 may perform a low pass filtering of the edge detection signal PE to generate a first signal F0. The comparison circuit 130 may compare the first signal FO with a reference voltage (not shown).

The trigger circuit 140 may delay a reset signal RESET by a first time period to generate a first control signal DRE, and delay the first control signal DRE by a second time period to generate a second control signal DDRE. In addition, the first control circuit may delay the reset signal RESET by a third time period different than the first time period to generate the second control signal DDRE. The selection circuit 150 may selectively output the first control signal DRE and an output signal SCLK of the comparison circuit 130 as an output signal SCLKP in response to the second control signal DDRE.

The gating circuit 160 may gate the delayed input signal DDIN in response to the output signal SCLKP of the selection circuit 150 to generate an output signal or data output signal DOUT. The gating circuit 160 may be reset in response to the reset signal RESET.

The short pulse rejection circuit 100 may delay the input signal DIN to generate the delayed input signal DDIN, integrate the input signal DIN, compare the integrated signal with the reference voltage to generate a sampling clock signal, and output the delayed input signal DDIN by sampling the delayed input signal DDIN in response to the sampling clock signal.

Figure 2:
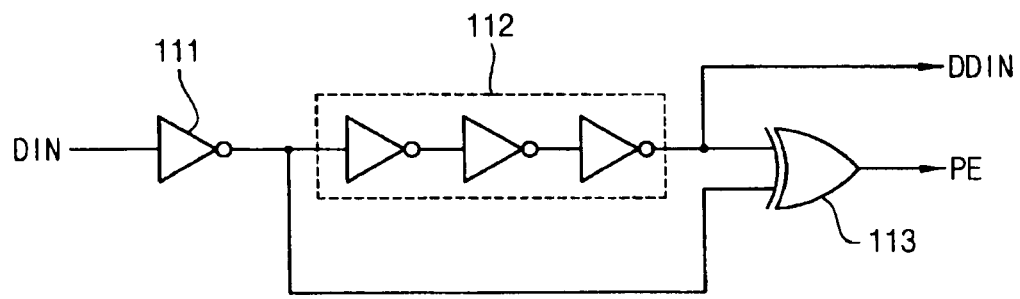
FIG. 2 is a circuit diagram illustrating an example of an edge detector in the short pulse rejection circuit of FIG. 1.

FIG. 2 is a circuit diagram illustrating an example of an edge detector in the short pulse rejection circuit of FIG. 1.

Referring to FIG. 2, the edge detector 110 may include a first inverter 111, a delay circuit 112, and an XOR gate 113.

The first inverter 111 may invert an input signal DIN. The delay circuit 112 may delay an output signal of the first inverter 111. The XOR gate 113 may perform a logical exclusive-OR operation on the output signal of the first inverter 111 and an output signal of the delay circuit 112 to output an edge detection signal PE. The delay circuit 112 may include an odd number of inverters. For example, although three inverters are shown in the delay circuit 112, it would be obvious to one of ordinary skill in the art that example embodiments are not limited thereto and that modifications in the number of inverters are intended to be included within the scope of example embodiments.

The edge detection signal PE may be a pulse-train signal including pulses that are generated in response to each edge of the input signal DIN.

Figure 3:
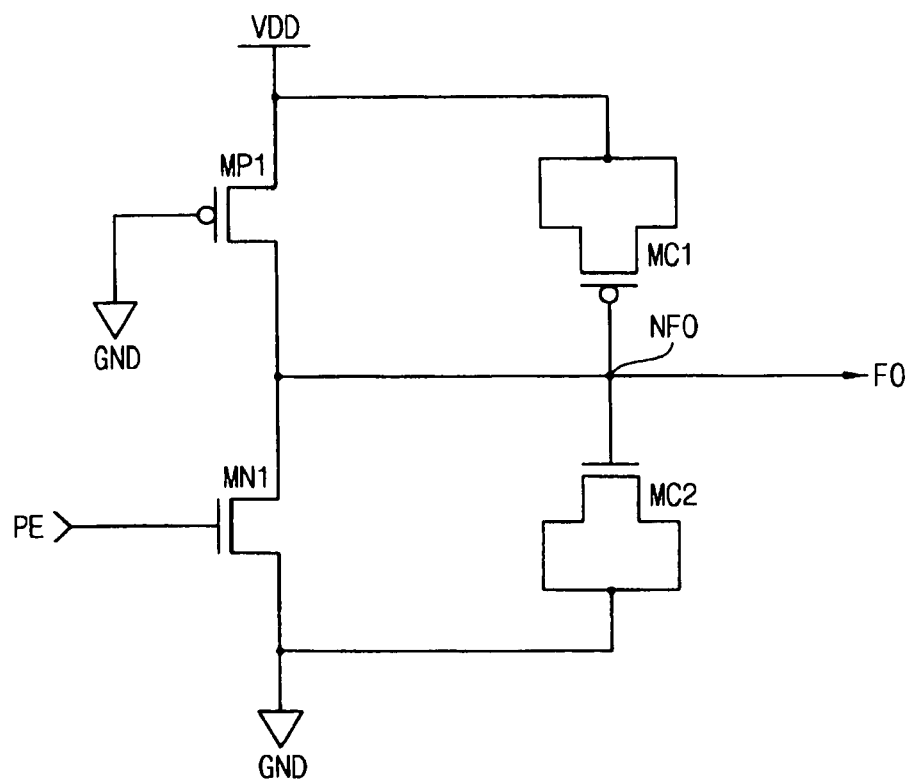
FIG. 3 is a circuit diagram illustrating an example of a filter circuit in the short pulse rejection circuit of FIG. 1.

FIG. 3 is a circuit diagram illustrating an example of a filter circuit in the short pulse rejection circuit of FIG. 1.

Referring to FIG. 3, the filter circuit 120a may include a first P-type metal oxide semiconductor (PMOS) transistor MP1, a first N-type metal oxide semiconductor (NMOS) transistor MN1, a first capacitor MC1, and a second capacitor MC2. The filter circuit 120a may output a first signal F0 through an output node NF0.

The first PMOS transistor MP1 includes a gate that receives a ground voltage GND, a source that receives a supply voltage VDD, and a drain that is coupled to the output node NF0. The first NMOS transistor MN1 includes a gate that receives an edge detection signal PE, a source that receives the ground voltage GND, and a drain that is coupled to the output node NF0. The first capacitor MC1 is coupled between the supply voltage VDD and the output node NF0. The second capacitor MC2 is coupled between the ground voltage GND and the output node NF0.

As illustrated in FIG. 3, the first capacitor MC1 and the second capacitor MC2 may be implemented with MOS capacitors.

Figure 4:
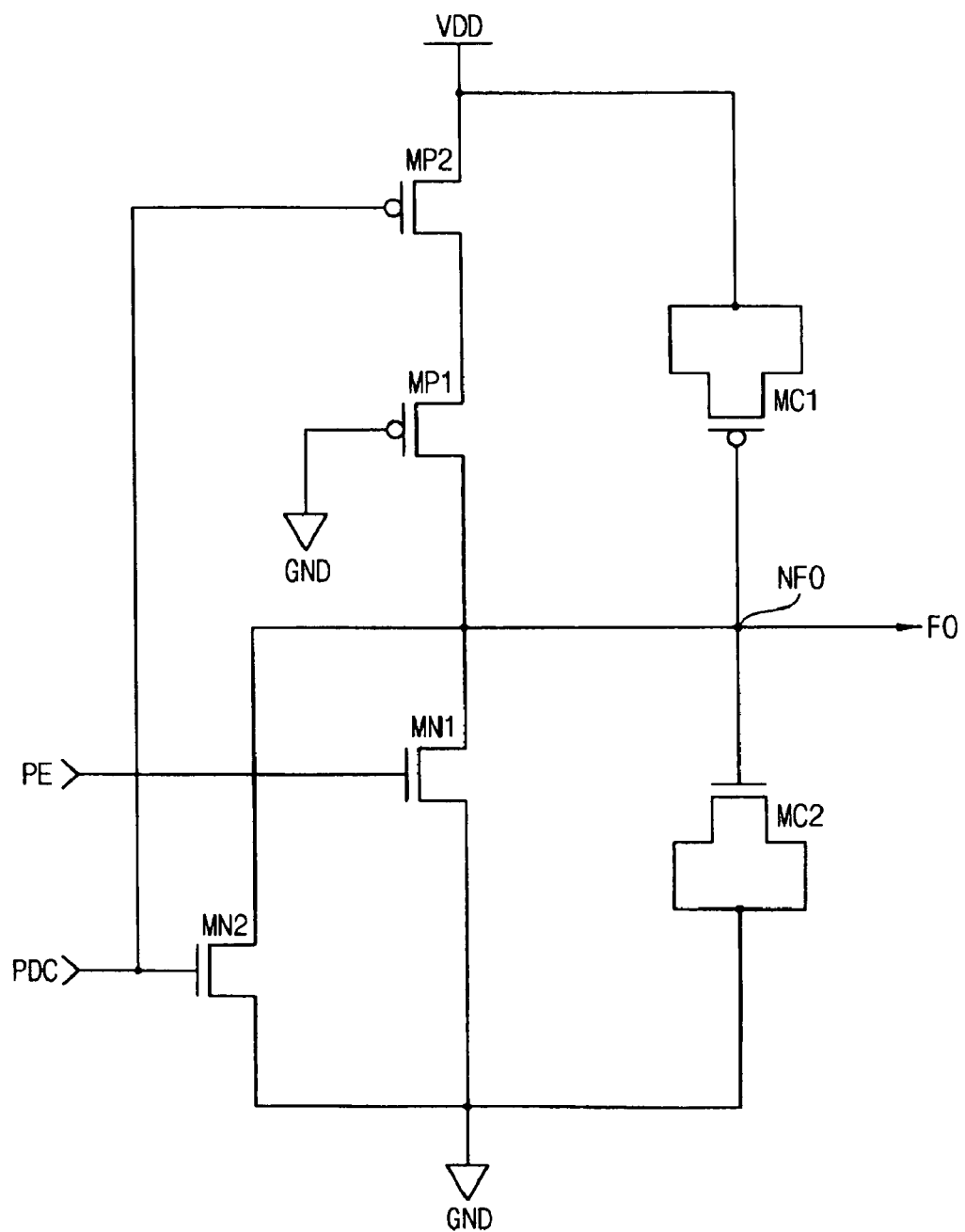
FIG. 4 is another circuit diagram illustrating an example of a filter circuit in the short pulse rejection circuit of FIG. 1.

FIG. 4 is another circuit diagram illustrating an example of a filter circuit in the short pulse rejection circuit of FIG. 1.

Referring to FIG. 4, the filter circuit 120 may include a first PMOS transistor MP1, a second PMOS transistor MP2, a first NMOS transistor MN1, a second NMOS transistor MN2, a first capacitor MC1, and a second capacitor MC2. The filter circuit 120 may output a first signal F0 through an output node NF0.

The first PMOS transistor MP1 includes a gate that receives a ground voltage GND and a drain that is coupled to the output node NF0. The second PMOS transistor MP2 includes a gate that receives a power-down control signal PDC, a drain that is coupled to the source of the first PMOS transistor MP1, and a source that receives a supply voltage VDD. The first NMOS transistor MN1 includes a gate that receives an edge detection signal PE, a source that receives the ground voltage GND, and a drain that is coupled to the output node NF0. The second NMOS transistor MN2 includes a gate that receives the power-down control signal PDC, a source that receives the ground voltage GND, and a drain that is coupled to the output node NF0. The first capacitor MC1 is coupled between the supply voltage VDD and the output node NF0. The second capacitor MC2 is coupled between the ground voltage GND and the output node NF0.

As illustrated in FIG. 4, the first capacitor MC1 and the second capacitor MC2 may be implemented with MOS capacitors.

A pulse width of a short pulse that is rejected by a short pulse rejection circuit 100 of FIG. 1 may be determined by controlling a turn-on resistance of the first PMOS transistor MP1 and capacitances of the first and second capacitors MC1 and MC2.

Figure 5:
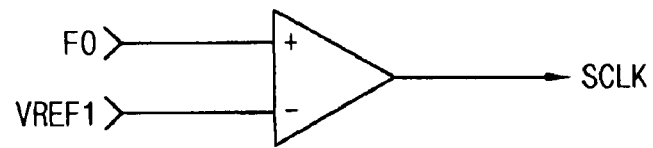
FIG. 5 is a circuit diagram illustrating an example of a comparison circuit in the short pulse rejection circuit of FIG. 1.

FIG. 5 is a circuit diagram illustrating an example of a comparison circuit in the short pulse rejection circuit of FIG. 1.

Referring to FIG. 5, the comparison circuit 130a may be a circuit having a structure of an operational amplifier. The comparison circuit 130a may compare a first signal F0 from the filter circuit 120 with a reference voltage VREF1 to output a first sampling clock signal SCLK. A pulse width of a short pulse that is rejected by a short pulse rejection circuit 100 of FIG. 1 may be determined by controlling the reference voltage VREF1, in addition to controlling a turn-on resistance of the first PMOS transistor MP1 and capacitances of the first and second capacitors MC1 and MC2 as described above.

Figure 6:
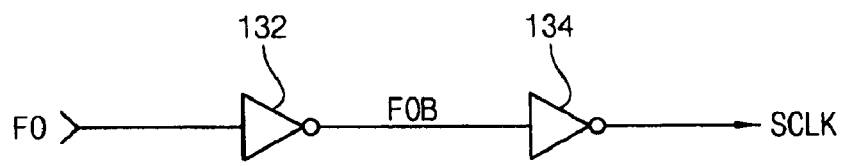
FIG. 6 is another circuit diagram illustrating an example of a comparison circuit in the short pulse rejection circuit of FIG. 1.

FIG. 6 is another circuit diagram illustrating an example of a comparison circuit in the short pulse rejection circuit of FIG. 1.

Referring to FIG. 6, the comparison circuit 130b may include a second inverter 132 and a third inverter 134. The third inverter 134 may be serially coupled to the second inverter 132.

Figure 7:
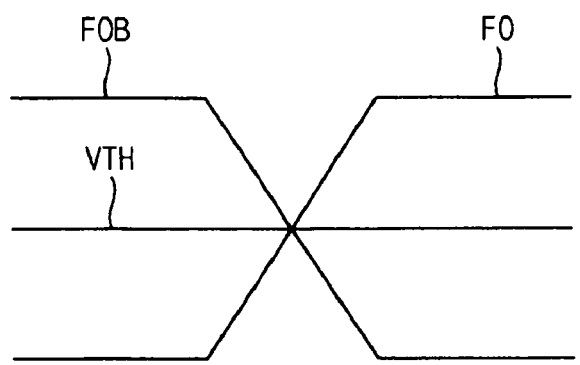
FIG. 7 is a diagram illustrating input/output waveforms of an inverter in the comparison circuit of FIG. 6.

FIG. 7 is a diagram illustrating input/output waveforms of an inverter in the comparison circuit of FIG. 6.

Referring to FIG. 6 and FIG. 7, an output voltage FOB of a second inverter 132 may be changed from a logic "high" state to a logic "low" state when a voltage of a first signal F0 that is input to the second inverter 132 is bigger than a threshold voltage VTH. As such, the comparison circuit of FIG. 6 may use the threshold voltage VTH of transistors in the inverters as a substitute for the reference voltage VREF1 of FIG. 5. A first sampling clock signal SCLK that is an output signal of a third inverter 134 may have the same phase as the first signal F0. Therefore, the comparison circuit 130b of FIG. 6 may be a circuit that compares a first signal F0 with the threshold voltage VTH as a reference voltage.

Figure 8:
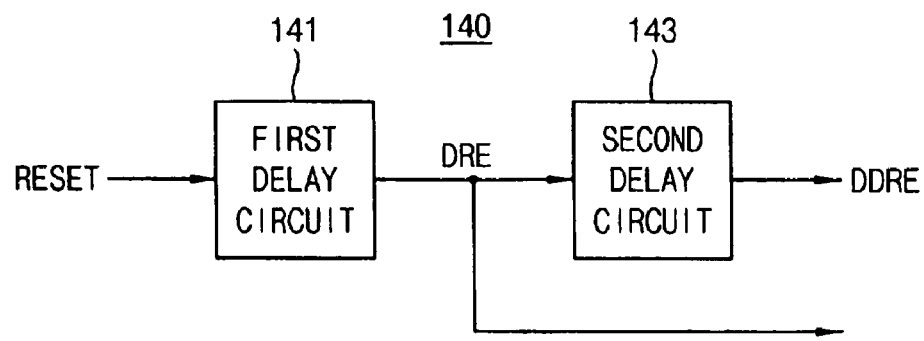
FIG. 8 is a block diagram illustrating an example of a trigger circuit in the short pulse rejection circuit of FIG. 1.

FIG. 8 is a block diagram illustrating an example of a trigger circuit in the short pulse rejection circuit of FIG. 1.

Referring to FIG. 8, the trigger circuit 140 may include a first delay circuit 141 and a second delay circuit 143.

The first delay circuit 141 may delay a reset signal RESET by a first time period to generate a first control signal DRE. The second delay circuit 143 may delay the first control signal DRE by a second time period to generate a second control signal DDRE.

Figure 9:
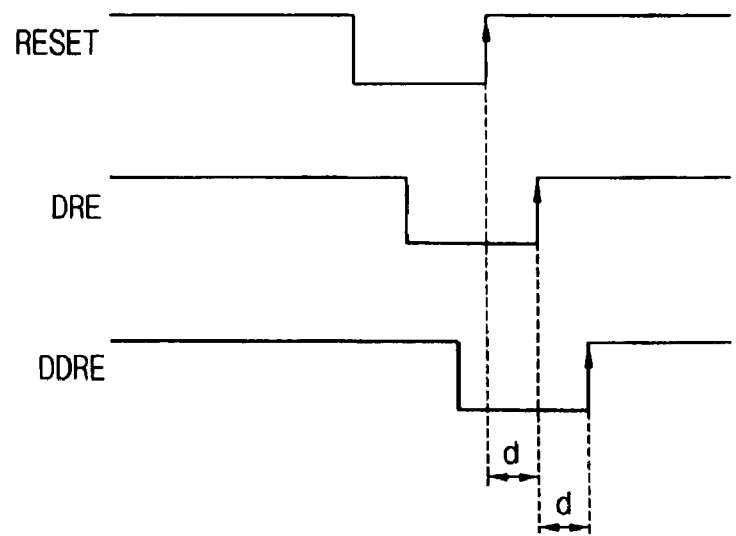
FIG. 9 is a timing diagram illustrating an operation of the trigger circuit of FIG. 8.

FIG. 9 is a timing diagram illustrating an operation of the trigger circuit of FIG. 8.

Referring to FIG. 9, a first control signal DRE may be a signal generated by delaying a reset signal RESET by a time period d. A second control signal DDRE may be a signal generated by delaying the first control signal DRE by the time period d.

Figure 10:
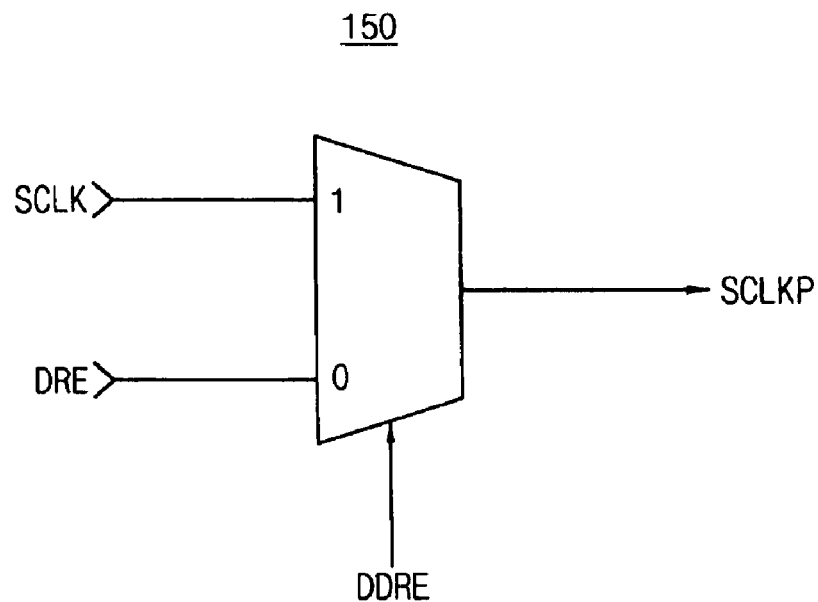
FIG. 10 is a circuit diagram illustrating an example of a selection circuit in the short pulse rejection circuit of FIG. 1.

FIG. 10 is a circuit diagram illustrating an example of a selection circuit in the short pulse rejection circuit of FIG. 1.

Referring to FIG. 10, the selection circuit 150 may include a multiplexer. The selection circuit 150 may select one of a first control signal DRE and a first sampling clock signal SCLK in response to a second control signal DDRE, and output the selected first control signal DRE or the first sampling clock signal SCLK as a second sampling clock signal SCLKP.

For example, when the second control signal DDRE has a logic "high" state, the selection circuit 150 may output the first sampling clock signal SCLK as the second sampling clock signal SCLKP. When the second control signal DDRE has a logic "low" state, the selection circuit 150 may output the first control signal DRE as the second sampling clock signal SCLKP.

Figure 11:
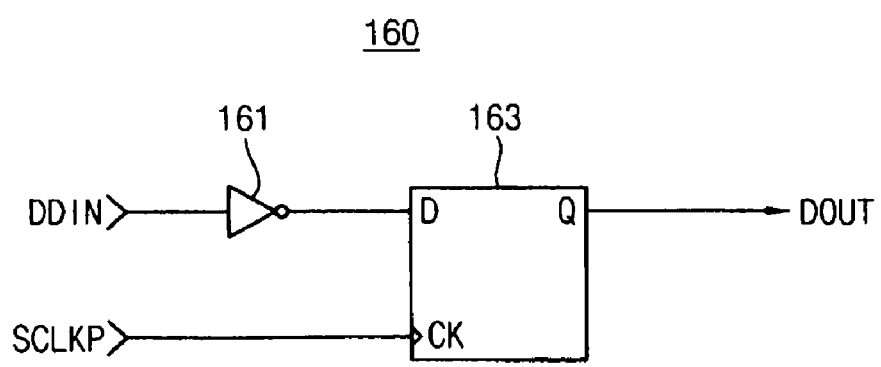
FIG. 11 is a circuit diagram illustrating an example of a gating circuit in the short pulse rejection circuit of FIG. 1.

FIG. 11 is a circuit diagram illustrating an example of a gating circuit in the short pulse rejection circuit of FIG. 1.

Referring to FIG. 11, the gating circuit 160 may include a fourth inverter 161 and a D flip-flop 163.

The fourth inverter 161 may invert a delayed input signal DDIN. The D flip-flop 163 may invert an output signal of the fourth inverter 161 in response to a second sampling clock signal SCLKP to generate an output signal or data output signal DOUT.

Figure 12:
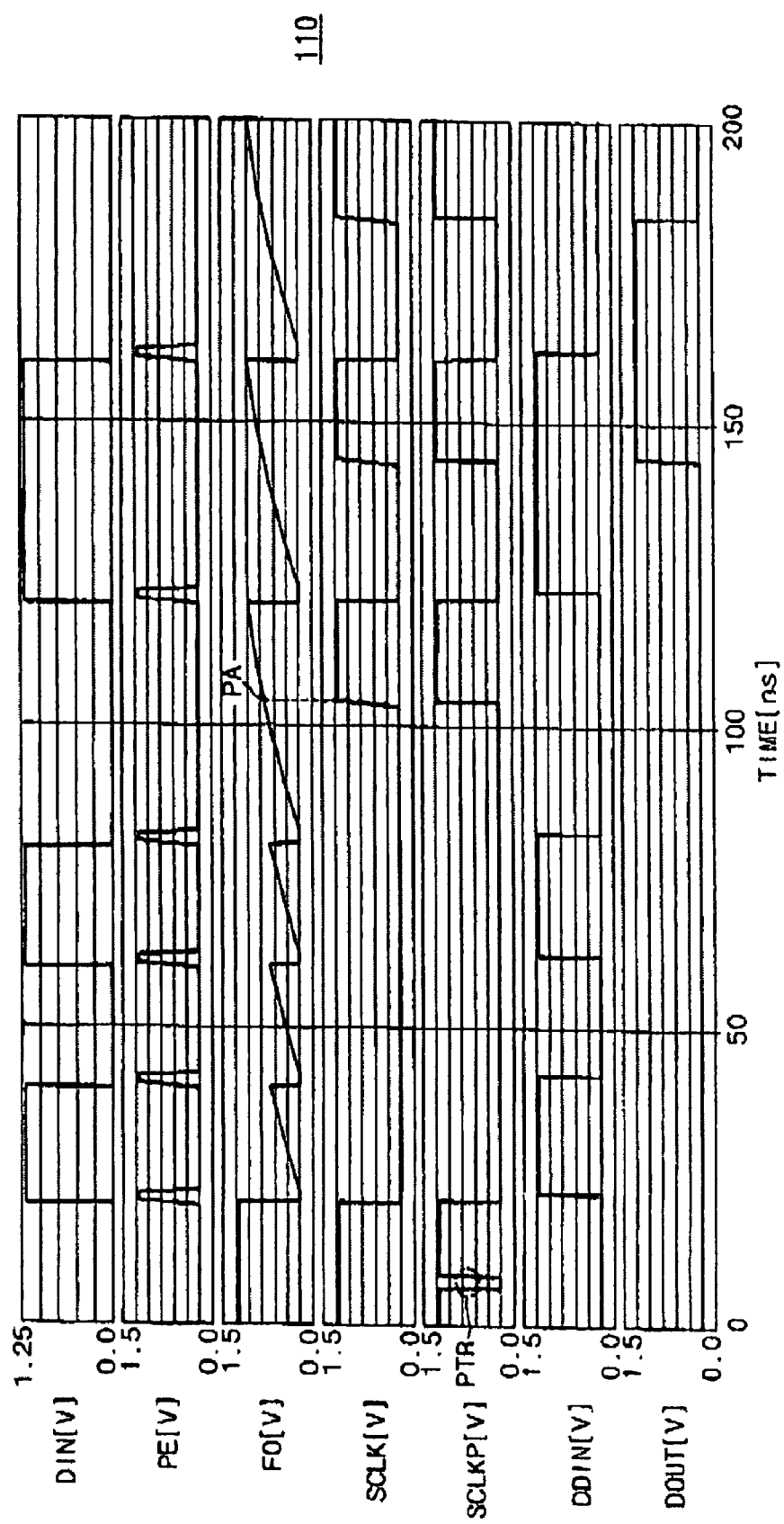
FIG. 12 is a timing diagram illustrating an operation of the short pulse rejection circuit of FIG. 1.

FIG. 12 is a timing diagram illustrating an operation of the short pulse rejection circuit of FIG. 1.

An input signal DIN, an edge detection signal PE, a first signal F0, a first sampling clock signal SCLK, a second sampling clock signal SCLKP, a delayed input signal DDIN and an output signal or data output signal DOUT are illustrated in FIG. 12.

Hereinafter, referring to FIG. 1 through FIG. 12, an operation of a short pulse rejection circuit 100 according to an example embodiment will be described in detail.

The short pulse rejection circuit 100 may perform a filtering operation and a comparing operation on an input signal DIN to generate a first sampling clock signal SCLK. A trigger circuit 140 and a selection circuit 150 may add a trigger pulse PTR to the first sampling clock signal SCLK to generate a second sampling clock signal SCLKP. A gating circuit 160 may output an output signal or data output signal DOUT by sampling a delayed input signal DDIN in response to the second sampling clock signal SCLKP. The delayed input signal DDIN may be generated by delaying an input signal DIN by a predetermined time period.

Referring to FIG. 12, an edge detection signal PE may be generated at each edge of an input signal DIN. A first signal F0 that is an output signal of a filter circuit 160 may be discharged whenever each pulse in the edge detection signal PE is generated. A first sampling clock signal SCLK may be a signal that has a logic "high" state when a voltage of the first signal F0 is bigger than a predetermined level. For example, the first sampling clock signal SCLK may be generated at a point PA where the voltage of the first signal F0 is, for example, about 0.7 V. A second sampling clock signal SCLKP may have a waveform generated by adding a trigger pulse PTR to the first sampling clock signal SCLK. A delayed input signal DDIN may be a signal generated by delaying the input signal DIN by a predetermined time period. The output signal DOUT may be a signal generated by sampling the delayed input signal DDIN in response to the second sampling clock signal SCLKP.

The short pulse rejection circuit 100 may have a sufficient setup/hold time margin of a D flip-flop 163 because the short pulse rejection circuit 100 may sample and output the delayed input signal DDIN.

In addition, the short pulse rejection circuit 100 may sample the input signal DIN during an initial operation using a trigger pulse PTR even when a state of the input signal DIN does not change because a sampling clock signal includes the trigger pulse PTR. The trigger pulse PTR may be generated during the initial operation using the control signals DRE and DDRE that are generated by delaying a reset signal RESET.

In addition, the short pulse rejection circuit 100 may reduce power consumptions by turning off a filter circuit 120b using a power-down control signal PDC in a power-down mode as illustrated in FIG. 4.

Figure 13:
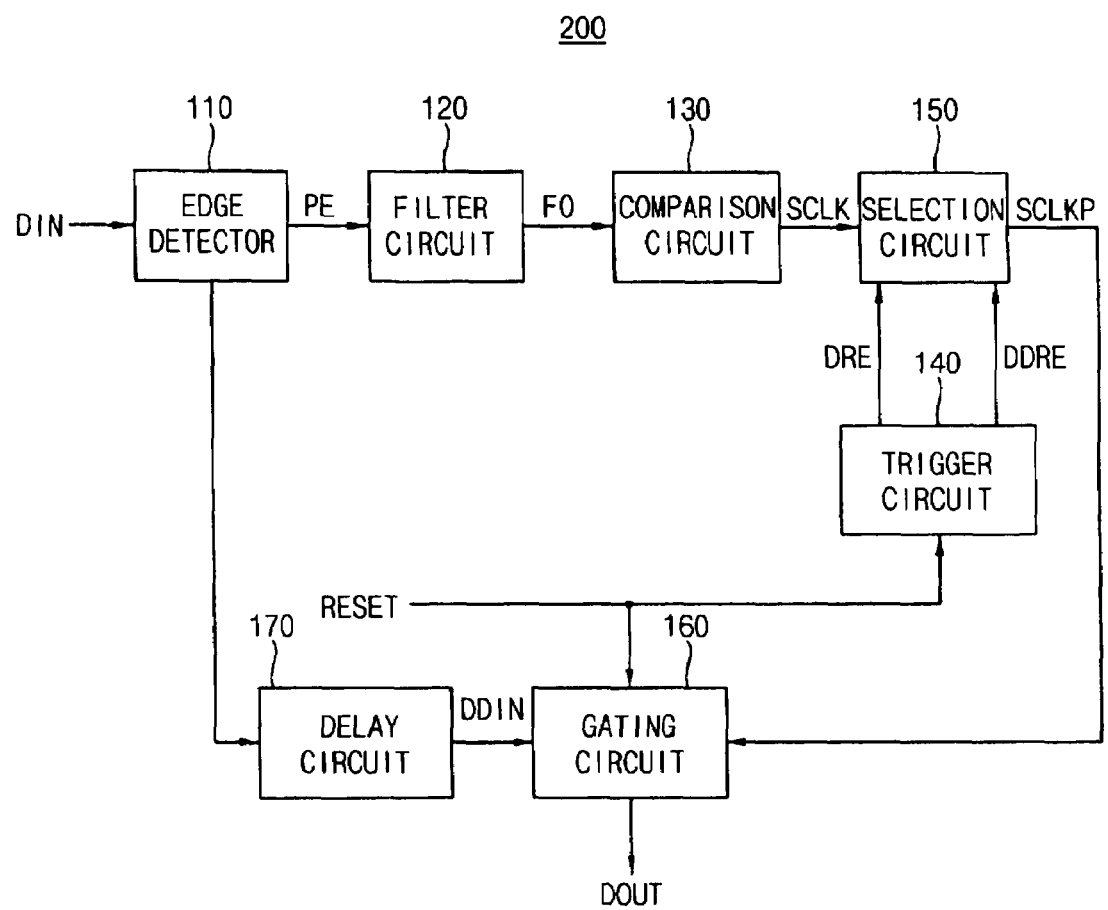
FIG. 13 is another block diagram illustrating a short pulse rejection circuit according to a example embodiments.

FIG. 13 is another block diagram illustrating a short pulse rejection circuit according to example embodiments.

Referring to FIG. 13, the short pulse rejection circuit 200 may include an edge detector 110, a filter circuit 120, a comparison circuit 130, a trigger circuit 140, a selection circuit 150, a delay circuit 170, and a gating circuit 160.

The delay circuit 170 may delay an input signal DIN to generate a delayed input signal DDIN. The edge detector 110 may detect an edge of the input signal DIN to generate an edge detection signal PE. The filter circuit 120 may perform a low pass filtering of the edge detection signal PE to generate a first signal F0. The comparison circuit 130 may compare the first signal F0 with a reference voltage (not shown). The trigger circuit 140 may delay a reset signal RESET by a first time period to generate a first control signal DRE, and delay the first control signal DRE by a second time period to generate a second control signal DDRE. The selection circuit 150 may selectively output one of the first control signal DRE and an output signal SCLK of the comparison circuit 130 in response to the second control signal DDRE. The gating circuit 160 may gate the delayed input signal DDIN in response to an output signal SCLKP of the selection circuit 150 to generate an output signal or data output signal DOUT. The gating circuit 160 may be reset in response to the reset signal RESET.

Unlike the short pulse rejection circuit 100 of FIG. 1, the short pulse rejection circuit 200 of FIG. 13 may include a delay circuit 170 that generates the delayed input signal DDIN. Therefore, the delay circuit 170 may be external to the edge detector 110 in the short pulse rejection circuit 200 of FIG. 13. Whereas in FIG. 1, the delayed input signal DDIN may be generated internal to the edge detector 110.

An operation of the short pulse rejection circuit 200 of FIG. 13 may be similar with an operation of the short pulse rejection circuit 100 of FIG. 1. Therefore, description of the operation of the short pulse rejection circuit 200 of FIG. 13 will be omitted.

Figure 14:
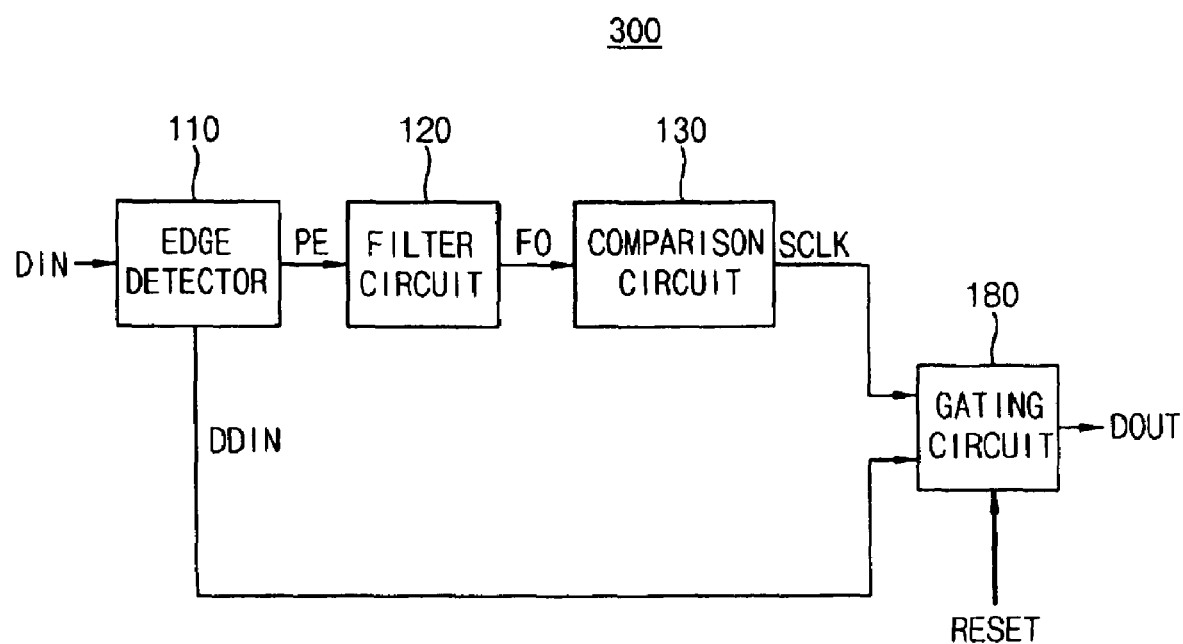
FIG. 14 is yet another block diagram illustrating a short pulse rejection circuit according to example embodiments.

FIG. 14 is yet another block diagram illustrating a short pulse rejection circuit according to example embodiments.

Referring to FIG. 14, the short pulse rejection circuit 300 may include an edge detector 110, a filter circuit 120, a comparison circuit 130, and a gating circuit 180.

The edge detector 110 may delay an input signal DIN to generate a delayed input signal DDIN, and detect an edge of the input signal DIN to generate an edge detection signal PE. The filter circuit 120 may perform a low pass filtering of the edge detection signal PE to generate a first signal F0. The comparison circuit 130 may compare the first signal FO with a reference voltage. The gating circuit 180 may gate the delayed input signal DDIN in response to an output signal SCLK of the comparison circuit 130 to generate an output signal or data output signal DOUT. The gating circuit 180 may be reset in response to the reset signal RESET.

Unlike the short pulse rejection circuit 100 of FIG. 1, the short pulse rejection circuit 300 of FIG. 14 does not include a trigger circuit 140 and a selection circuit 150. In the short pulse rejection circuit 300 of FIG. 14, the gating circuit 180 may gate the delayed input signal DDIN in response to a sampling clock signal that is the output signal SCLK of the comparison circuit 130, and generate the output signal DOUT.

An operation of the short pulse rejection circuit 300 of FIG. 14 may be similar with an operation of the short pulse rejection circuit 100 of FIG. 1. Therefore, description of the operation of the short pulse rejection circuit 300 of FIG. 14 will be omitted.

Figure 15:
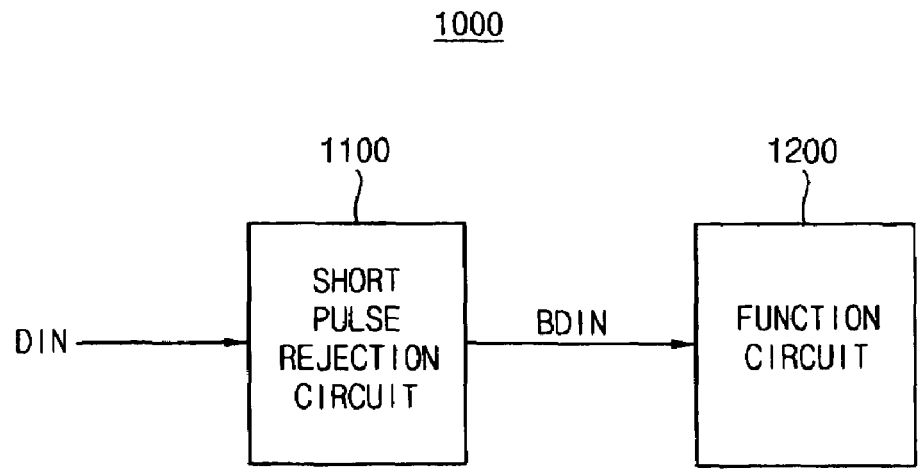
FIG. 15 is a block diagram illustrating a semiconductor device having a short pulse rejection circuit according to example embodiments.

FIG. 15 is a block diagram illustrating a semiconductor device having a short pulse rejection circuit according to example embodiments.

Referring to FIG. 15, the semiconductor device 1000 may include a short pulse rejection circuit 1100 and a function circuit 1200.

The short pulse rejection circuit 1100 may delay an input signal DIN to generate a delayed input signal DDIN, detect an edge of the input signal DIN to generate an edge detection signal PE, perform a low pass filtering of the edge detection signal PE to generate an integrated signal, compare the integrated signal with a reference voltage to generate a sampling clock signal, and gate the delayed input signal DDIN in response to the sampling clock signal to generate a first signal BDIN. The function circuit 1200 may perform signal processing on the first signal BDIN.

The short pulse rejection circuit 1100 in FIG. 15 may have the same structure as any one of the short pulse rejection circuit 100 of FIG. 1, the short pulse rejection circuit 200 of FIG. 13, and the short pulse rejection circuit 300 of FIG. 14.

The short pulse rejection circuit according to example embodiments may be applicable to a receiver circuit that receives data, for example, to a semiconductor device that receives data and performs data processing.

While the example embodiments and their advantages have been described in detail, it should be understood that various changes, substitutions and alterations may be made herein without departing from the scope of example embodiments.

What is claimed is:

1. A short pulse rejection circuit comprising:
   an edge detector configured to delay an input signal to generate a delayed input signal, and configured to detect an edge of the input signal to generate an edge detection signal;
   a filter circuit configured to perform a low pass filtering on the edge detection signal to generate a first signal;
   a comparison circuit configured to compare the first signal with a reference voltage; and
   a gating circuit configured to gate the delayed input signal based on an output signal of the comparison circuit.

2. The short pulse rejection circuit of claim 1, wherein the edge detector includes,
   a first inverter configured to invert the input signal,
   a delay circuit configured to delay an output signal of the first inverter, and
   a XOR gate configured to perform a logical exclusive-OR operation on an output signal of the first inverter and an output signal of the delay circuit.

3. The short pulse rejection circuit of claim 2, wherein the delay circuit includes an odd number of inverters.

4. The short pulse rejection circuit of claim 1, wherein the filter circuit includes,
   a first PMOS transistor having a gate that receives a ground voltage, a source that receives a supply voltage, and a drain that is coupled to an output node,
   a first NMOS transistor having a gate that receives the edge detection signal, a source that receives the ground voltage, and a drain that is coupled to the output node,
   a first capacitor coupled between the supply voltage and the output node, and
   a second capacitor coupled between the ground voltage and the output node.

5. The short pulse rejection circuit of claim 4, wherein each of the first and second capacitor includes a MOS capacitor.

6. The short pulse rejection circuit of claim 1, wherein the filter circuit includes,
   a first PMOS transistor having a gate that receives a ground voltage and a drain that is coupled to an output node,
   a second PMOS transistor having a gate that receives a power-down control signal, a drain that is coupled to a source of the first PMOS transistor, and a source that receives the supply voltage,
   a first NMOS transistor having a gate that receives the edge detection signal, a source that receives the ground voltage, and a drain that is coupled to the output node,
   a second NMOS transistor having a gate that receives the power-down control signal, a source that receives the ground voltage, and a drain that is coupled to the output node,
   a first capacitor coupled between the supply voltage and the output node, and
   a second capacitor coupled between the ground voltage and the output node.

7. The short pulse rejection circuit of claim 6, wherein each of the first and second capacitor includes a MOS capacitor.

8. The short pulse rejection circuit of claim 1, further comprising:
   a trigger circuit configured to delay a reset signal by a first time period to generate a first control signal, and configured to delay the first control signal by a second time period to generate a second control signal; and
   a selection circuit configured to selectively output one of the first control signal and the output signal of the comparison circuit in response to the second control signal, wherein
   the gating circuit gates the delayed input signal in response to the output of the selection circuit.

9. The short pulse rejection circuit of claim 8, wherein the short pulse rejection circuit samples and outputs the input signal regardless of whether the input signal transitions during an initial operation.

10. The short pulse rejection circuit of claim 8, wherein the trigger circuit includes, a first delay circuit configured to delay the reset signal by the first time period to generate the first control signal, and a second delay circuit configured to delay the first control signal by the second time period to generate the second control signal.

11. The short pulse rejection circuit of claim 8, wherein the selection circuit outputs the first control signal when a state of the second control signal is a disable state, and outputs the output signal of the comparison circuit when the state of the second control signal is an enable state.

12. The short pulse rejection circuit of claim 8, wherein an output signal of the selection circuit is a signal of a pulse waveform that has a pulse width of the second time period.

13. The short pulse rejection circuit of claim 8, wherein the first time period is substantially the same as the second time period.

14. The short pulse rejection circuit of claim 1, wherein the delayed input signal is generated by a delay circuit external to the edge detector.

15. A semiconductor device, comprising:

the short pulse rejection circuit of claim 1, where the gating circuit outputs a data output signal; and a function circuit configured to perform a signal processing on the data output signal.

16. A method of rejecting a short pulse, comprising:

delaying an input signal to generate a delayed input signal;

detecting an edge of the input signal to generate an edge detection signal;

performing a low pass filtering on the edge detection signal to generate a first signal;

comparing the first signal with a reference voltage; and gating the delayed input based on the comparing.

17. The method of claim 16, further comprising:

delaying a reset signal by a first time period to generate a first control signal and delaying the first control signal by a second time period to generate a second control signal; and selectively outputting one of the first control signal and the output signal of the comparing in response to the second control signal, wherein the gating gates the delayed input signal in response to the selectively outputting.

18. The method of claim 16, further comprising:

performing a signal processing on an output signal of the gating.

* * * * *